US010446250B2

(12) United States Patent
Pai et al.

(10) Patent No.: US 10,446,250 B2
(45) Date of Patent: Oct. 15, 2019

(54) SHIFT REGISTER

(71) Applicant: AU OPTRONICS CORPORATION, Hsin-chu (TW)

(72) Inventors: Cheng-Chiu Pai, Hsin-chu (TW); Ming-Hung Chuang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 195 days.

(21) Appl. No.: 15/813,702

(22) Filed: Nov. 15, 2017

(65) Prior Publication Data

US 2018/0350444 A1    Dec. 6, 2018

(30) Foreign Application Priority Data

Jun. 2, 2017    (TW) .............................. 106118340 A (51) Int. Cl.
| | | |
|---|---|---|
| *G11C 19/00* | (2006.01) | |
| *G11C 19/28* | (2006.01) | |
| *G09G 3/00* | (2006.01) | |
| *H03K 19/017* | (2006.01) | |
| *G09G 3/20* | (2006.01) | |
| *G09G 3/36* | (2006.01) | |

(52) U.S. Cl.
CPC .............. *G11C 19/28* (2013.01); *G09G 3/003* (2013.01); *G09G 3/20* (2013.01); *H03K 19/01728* (2013.01); *G09G 3/3677* (2013.01); *G09G 2300/0408* (2013.01); *G09G 2310/0286* (2013.01); *G09G 2320/0214* (2013.01); *G09G 2330/025* (2013.01); *G09G 2330/04* (2013.01)

(58) Field of Classification Search
None
See application file for complete search history.

(56) References Cited

U.S. PATENT DOCUMENTS

| | | | | |
|---|---|---|---|---|
| 9,449,712 | B2 | 9/2016 | Pai et al. | |
| 10,127,875 | B2* | 11/2018 | Wu ........................ | G11C 19/28 |
| 2015/0179277 | A1* | 6/2015 | Pai ........................... | G09G 3/20 |
| | | | | 377/68 |
| 2015/0206597 | A1* | 7/2015 | Liao ...................... | G11C 19/28 |
| | | | | 377/70 |

(Continued)

FOREIGN PATENT DOCUMENTS

TW                201601135 A        1/2016

*Primary Examiner* — Tuan T Lam
(74) *Attorney, Agent, or Firm* — Tim Tingkang Xia, Esq.; Locke Lord LLP (57) ABSTRACT

A shift register includes a first switch and a second switch coupled to a first node, a pull-down circuit selectively connecting the first node to a voltage end according to a potential of a second node, a control circuit, and an input stage circuit which may receive a previous-stage shift register output signal, a next-stage shift register output signal, and at least one scanning order logic signal. The first switch receives clock signals. A first output end of the input stage circuit outputs the previous-stage shift register output signal or the next-stage shift register output signal to a control end of the second switch based on the scanning order logic signal. The previous-stage shift register output signal or the next-stage shift register output signal triggers a second output end of the input stage circuit to output the scanning order logic signal to an input end of the control circuit.

12 Claims, 5 Drawing Sheets

(56) References Cited

U.S. PATENT DOCUMENTS

| | | | |
|---|---|---|---|
| 2016/0086562 A1* | 3/2016 | Tan ..................... | G09G 3/3677 |
| | | | 345/215 |
| 2017/0039971 A1* | 2/2017 | Huang ................. | G09G 3/3677 |
| 2017/0061922 A1* | 3/2017 | Wang ................... | G11C 19/184 |
| 2018/0047551 A1* | 2/2018 | Jones ................... | G01N 33/487 |
| 2018/0151241 A1* | 5/2018 | Qing ..................... | G11C 19/28 |
| 2018/0329547 A1* | 11/2018 | Wu ....................... | G11C 19/28 |

\* cited by examiner

FIG. 5

SHIFT REGISTER

CROSS-REFERENCE TO RELATED PATENT APPLICATION

This application claims priority to and the benefit of, pursuant to 35 U.S.C. § 119(a), patent application Serial No. 106118340 filed in Taiwan on Jun. 2, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

This disclosure relates to a drive circuit of a display panel, and in particular, to a shift register (SR) in a drive circuit.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In the increasingly competitive display panel industry, to meet consumers' requirements on electronic products, current electronic products tend to be thinner. However, when a display panel element is operated a long time, an element degradation problem may be caused; as a result, a threshold voltage of a transistor increases. Alternatively, a display panel with a transistor having a large threshold voltage may be manufactured during display panel processing, lowering a drive capability of a shift register circuit, and reducing an operational window. An improvement approach is improving quality of the transistor, so that the transistor is not prone to degradation. However, this manner may increase material costs of the transistor. Therefore, it is not an optimum solution in terms of the product period of consumer electronic products.

SUMMARY

A technical implementation aspect of this disclosure relates to a shift register, including: a first switch, a second switch, a pull-down circuit, a control circuit, and an input stage circuit. A first end of the first switch is configured to receive a first clock signal, a second end of the first switch is coupled to an output end of the shift register, and a control end of the first switch is coupled to a first node. A first end of the second switch is coupled to a first voltage end, and a second end of the second switch is coupled to the first node. The pull-down circuit is coupled between the first node and a second voltage end, a control end of the pull-down circuit is coupled to a second node, and the pull-down circuit selectively connects the first node to the second voltage end according to a potential of the second node. An output end of the control circuit is coupled to the second node. The input stage circuit receives a previous-stage shift register output signal, a next-stage shift register output signal, and at least one scanning order logic signal. A first output end of the input stage circuit outputs the previous-stage shift register output signal or the next-stage shift register output signal to a control end of the second switch according to the at least one scanning order logic signal, and a second output end of the input stage circuit is triggered by the previous-stage shift register output signal or the next-stage shift register output signal to output the at least one scanning order logic signal to an input end of the control circuit.

Therefore, according to the technical content of this disclosure, a shift register circuit is provided, to resolve problems that a drive capability of a shift register circuit is lowered and an operational range is reduced because a threshold voltage of a transistor increases due to a long time of operation on a display panel element.

With reference to the following implementations, a person of ordinary skill in the art of this disclosure can readily understand the basic spirit and other objectives of this disclosure, and the technical means and implementation aspects used in this disclosure.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

To make the descriptions of this disclosure more comprehensive, the following provides illustrative descriptions of the implementation aspects and the specific embodiments of this disclosure. However, this is not the only form for implementing or applying the specific embodiments of this disclosure. The implementations cover features of multiple specific embodiments and method steps used to construct and operate these specific embodiments and a sequence of the steps. However, other specific embodiments may also be used to achieve a same or equivalent function and step sequence.

Unless otherwise defined in this specification, the meanings of scientific and technical terms used herein are the same as the meanings understood and commonly used by a person of ordinary skill in the art of this disclosure. In addition, without being in conflict with the context, a singular noun used in this specification covers the plural form of the noun, and a used plural noun also covers the singular form of the noun.

In addition, as used herein, "coupled" may mean that two or more elements are either in direct physical or electrical contact, or that two or more elements are not in direct contact with each other but yet still co-operate or interact with each other.

To resolve problems that a drive capability of a drive circuit is lowered and an operational range is reduced because a threshold voltage Vth of a transistor increases due to degradation of a display panel element caused by a long time of operation, this disclosure provides a shift register, which may enhance the drive capability of the drive circuit, and provide a large operational range.

Figure 1:
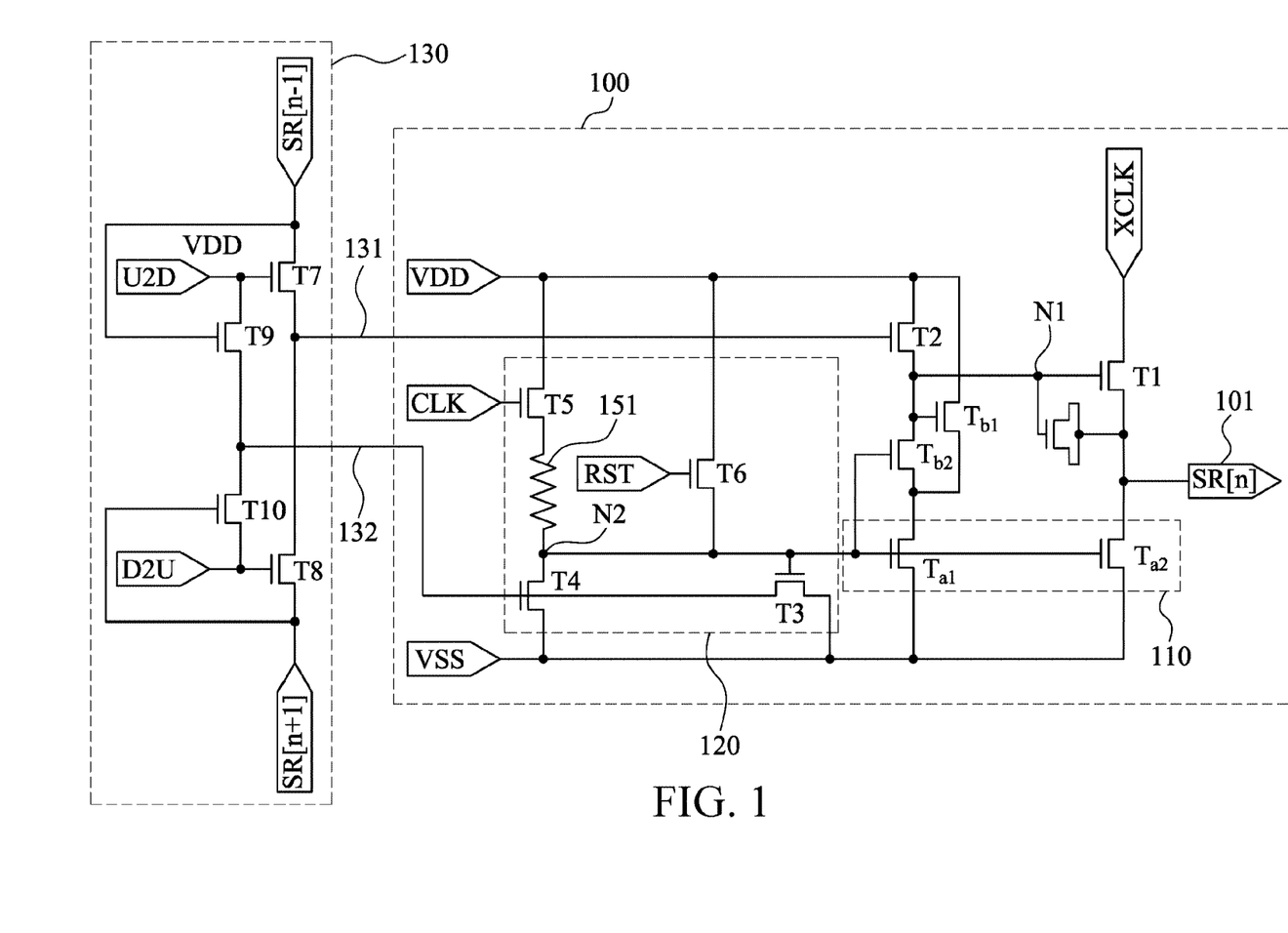
FIG. 1 is a schematic diagram of a shift register according to an embodiment of this disclosure.

FIG. 1 is a schematic diagram of a shift register according to an embodiment of this disclosure. As shown in FIG. 1, a shift register 100 includes: a first switch T1, a second switch T2, a pull-down circuit 110, a control circuit 120, and an input stage circuit 130. The input stage circuit 130 receives a previous-stage shift register output signal SR[n−1], a next-stage shift register output signal SR[n+1], and at least one scanning order logic signal, provides a first output signal to a control end of the second switch T2 by using a first output end 131, and provides a second output signal to an input end of the control circuit 120 by using a second output end 132. The input end of the control circuit 120 is coupled to the second output end 132 of the input stage circuit 130. The at least one scanning order logic signal may be an up-to-down (U2D) scanning order logic signal, or may be a down-to-up (D2U) scanning order logic signal. A first end of the second switch T2 is coupled to a first voltage end VDD. A second end of the second switch T2 is coupled to a first node N1 and provides a voltage driving the first switch T1. A control end of the first switch T1 is coupled to the first node N1. The first switch T1 is driven to provide an output to be displayed on a screen or a display, and its output signal is SR[n]. The pull-down circuit 110 is coupled between the first node N1 and a second voltage end VSS, to pull down a voltage level that is output to the first switch T1 by the second switch T2 by using the first node N1. The control circuit 120 receives the output of the second output end 132 of the input stage circuit 130 as an input, and provides the output to the pull-down circuit 110 by using a second node N2.

Referring to FIG. 1, during operation, the input stage circuit 130 is configured to receive the previous-stage shift register output signal shift register[n−1], the next-stage shift register output signal shift register[n+1], and the at least one scanning order logic signal. The first output end 131 of the input stage circuit 130 outputs the previous-stage shift register output signal SR[n−1] or the next-stage shift register output signal SR[n+1] to the control end of the second switch T2 according to the at least one scanning order logic signal, and the second output end 132 of the input stage circuit 130 is triggered by the previous-stage shift register output signal SR[n−1] or the next-stage shift register output signal SR[n+1] to output the at least one scanning order logic signal to the input end of the control circuit 120.

Further referring to FIG. 1, during operation, the control end of the second switch T2 receives the output signal of the first output end 131 of the input stage circuit 130. The first end of the second switch T2 is coupled to the first voltage end VDD, and the second end of the second switch T2 is coupled to the first node N1. The control end of the first switch T1 is coupled to the first node N1, to couple to the second end of the second switch T2. The first end of the first switch T1 is configured to receive a first clock signal XCLK. A second end of the first switch T1 is coupled to an output end 101 of the shift register 100, to provide an output to be displayed on a screen or a display, and its output signal is SR[n]. Referring to FIG. 1, the pull-down circuit 110 is coupled between the first node N1 and the second voltage end VSS. A control end of the pull-down circuit 110 is coupled to the second node N2. In addition, the pull-down circuit 110 may selectively connect the first node N1 to the second voltage end VSS according to a potential of the second node N2. An output end of the control circuit 120 is coupled to the second node N2.

Referring to FIG. 1, the pull-down circuit 110 includes a switch $T_{a1}$ and a switch $T_{a2}$. A second end of the switch $T_{a1}$ is coupled to the second voltage end VSS, and a control end of the switch $T_{a1}$ is coupled to a control end of the third switch T3 and a control end of the switch $T_{a2}$. A first end of the switch $T_{a2}$ is coupled to the output end 101 of the shift register 100, and a second end of the switch $T_{a2}$ is coupled to the second voltage end VSS. Further referring to FIG. 1, a circuit formed by a switch $T_{b1}$ and a switch $T_{b2}$ may restrain a sharp voltage decrease of the first node N1 caused by current leakage of the switch $T_{a1}$. For example, in time periods P1 and P2, a voltage of the first node N1 is a high voltage; although the switch $T_{a1}$ is in an off state, current leakage of the switch $T_{a1}$ still causes the high voltage of the first node N1 to leak a current to VSS. In this case, the switch $T_{b1}$ and the switch $T_{b2}$ form a protection circuit, so that the shift register 100 of this disclosure may have large current leakage tolerance. In terms of structure, a first end of the switch $T_{b2}$ is coupled to a control end of the switch $T_{b1}$ and the second end of the second switch T2, and a second end of the switch $T_{b2}$ is coupled to a second end of the switch $T_{b1}$. A first end of the switch $T_{b1}$ is coupled to the first voltage end VDD. The foregoing embodiment is merely an embodiment of the protection circuit, and this disclosure is not limited thereto.

In an embodiment, referring to FIG. 1, the control circuit 120 is coupled to the first voltage end VDD and the second voltage end VSS. During operation, the control circuit 120 also receives a second clock signal CLK, and the control circuit 120 controls the potential of the second node N2 according to the second clock signal CLK and the at least one scanning order logic signal.

In another embodiment, further referring to FIG. 1, the control circuit 120 may further include a third switch T3. A first end of the third switch T3 is coupled to the second output end 132 of the input stage circuit 130, a second end of the third switch T3 is coupled to the second voltage end VSS or the output end 101 of the shift register 100, and a control end of the third switch T3 is coupled to the second node N2.

In an embodiment, referring to FIG. 1, the control circuit 120 may further include a fourth switch T4, a fifth switch T5, and a sixth switch T6. A first end of the fourth switch T4 is coupled to the second node N2, a second end of the fourth switch T4 is coupled to the second voltage end VSS, and a control end of the fourth switch T4 is coupled to the second output end 132 of the input stage circuit 130. A first end of the fifth switch T5 is coupled to the first voltage end VDD, and a second end of the fifth switch T5 is coupled to the second node N2. A first end of the sixth switch T6 is coupled to the first voltage end VDD, and a second end of the sixth switch T6 is coupled to the second node N2. During operation, a control end of the fifth switch T5 receives the second clock signal CLK. A control end of the sixth switch T6 receives a reset signal RST. In an embodiment, the control circuit 120 may further include a resistor 151 coupled between the fifth switch T5 and the second node N2.

In another embodiment, further referring to FIG. 1, the input stage circuit 130 may include a seventh switch T7, an eighth switch T8, a ninth switch T9, and a tenth switch T10. A first end of the seventh switch T7 receives the previous-stage shift register output signal SR[n−1], and a second end of the seventh switch T7 is coupled to the first output end 131 of the input stage circuit 130. A first end of the eighth switch T8 receives the next-stage shift register output signal SR[n+1], and a second end of the eighth switch T8 is coupled to the first output end 131 of the input stage circuit 130. During operation, a control end of the seventh switch T7 receives a first scanning order logic signal U2D. A control end of the eighth switch T8 receives a second scanning order logic signal D2U. The second scanning order logic signal D2U is reverse to the first scanning order logic signal U2D in direction.

For example, when the shift register 100 operates in forward scanning (scanning from a previous stage to a next stage), the first scanning order logic signal U2D is set to a high level, and the seventh switch T7 is turned on, to transfer the previous-stage shift register output signal SR[n−1] to the first output end 131 of the input stage circuit 130; in this case, the second scanning order logic signal D2U is set to a low level, and the eighth switch T8 is turned off. In another aspect, when the shift register 100 operates in reverse scanning (scanning from the next stage to the previous stage), the first scanning order logic signal U2D is set to a high level, and the seventh switch T7 is turned off; in this case, the second scanning order logic signal D2U is set to a low level, and the eighth switch T8 is turned on, to transfer the next-stage shift register output signal SR[n+1] to the first output end 131 of the input stage circuit 130.

A second end of the ninth switch T9 is coupled to the second output end 132 of the input stage circuit 130. A second end of the tenth switch T10 is coupled to the second output end 132 of the input stage circuit 130. A first end of the ninth switch T9 receives the first scanning order logic signal U2D, and a control end of the ninth switch T9 receives the previous-stage shift register output signal SR[n−1]. A first end of the tenth switch T10 receives the second scanning order logic signal D2U, and a control end of the tenth switch T10 receives the next-stage shift register output signal SR[n+1]. The ninth switch T9 and the tenth switch T10 may selectively set the second output end 132 to a high level or low level according to a status of the previous-stage shift register output signal SR[n−1] or the next-stage shift register output signal SR[n+1]. The second output end 132 is configured to control the control circuit 120 in the shift register 100, and indirectly control the pull-down circuit 110.

Certainly, this disclosure is not limited to the first scanning order logic signal or the second scanning order logic signal. During implementation of this disclosure, a plurality of scanning order logic signals applied to the input stage circuit 130 may be used according to an actual requirement.

In an embodiment, further referring to FIG. 1, the pull-down circuit 110 may be coupled between the output end 101 of the shift register 100 and the second voltage end VSS, and the pull-down circuit 110 selectively connects the output end 101 of the shift register 100 to the second voltage end VSS according to the potential of the second node N2.

Figure 2:
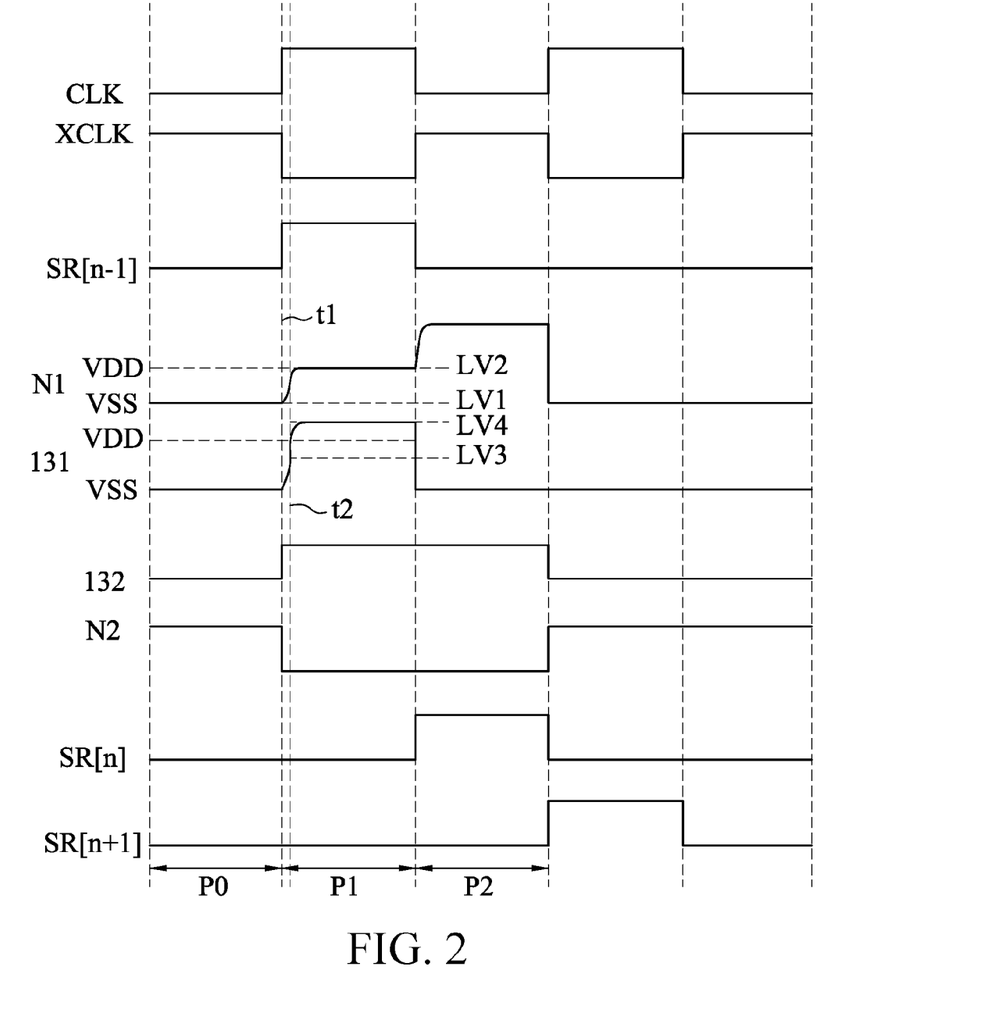
FIG. 2 is an operation timing diagram of the shift register according to the embodiment of FIG. 1.

FIG. 2 is an operation timing diagram of the shift register according to the embodiment of FIG. 1. In the example shown in FIG. 2, it is assumed that the shift register 100 operates in forward scanning (scanning from the previous stage to the next stage), that is, the first scanning order logic signal U2D is set to a high level, and the second scanning order logic signal D2U is set to a low level, but this disclosure is not limited thereto.

In the example shown in FIG. 2, the current-stage shift register 100 is triggered in the time period P2 to generate the current-stage output signal SR[n]. First, in the time period P0, as shown in FIG. 1 and FIG. 2, the previous-stage shift register output signal SR[n−1] is at a low potential, and therefore the first output end 131 and the second output end 132 are also at a low potential; in this case, the second switch T2 is not turned on, and therefore a potential of the first node N1 is also L. In this case, the second output end 132 is also at a low level, and the fourth switch T4 is turned off. The fifth switch T5 is turned on by a periodic clock signal CLK before the time period P0 (not shown in FIG. 2), so that the second node N2 is set to a high potential. In the time period P0, the second node N2 fluctuates around the high potential.

Referring to both FIG. 1 and FIG. 2, in the time period P1, a previous-stage shift register (relative to the current-stage shift register 100 in FIG. 1) outputs the previous-stage shift register output signal SR[n−1], and the previous-stage shift register output signal SR[n−1] is at a high potential. The previous-stage shift register output signal SR[n−1] passes through the seventh switch T7 (turned on by the first scanning order logic signal U2D) in the input stage circuit 130 so that a voltage of the first output end 131 increases with the previous-stage shift register output signal SR[n−1]. Meanwhile, the previous-stage shift register output signal SR[n−1] turns on the ninth switch T9 in the input stage circuit 130, so that a voltage of the second output end 132 increases with the ninth switch T9 (turned on by the first scanning order logic signal U2D).

It should be particularly noted that, from the time point t1, the voltage of the first output end 131 increases, and the second switch T2 is turned on when the voltage of the first output end 131 exceeds a threshold voltage of the second switch T2. When the second switch T2 is turned on, the first voltage end VDD charges the first node N1 by using the second switch T2, so that the voltage of the first node N1 increases quickly in a short time, and increases from a first level LV1 (which is approximately equal to a potential of the second voltage end VSS in this embodiment) to a second level LV2 (which is approximately equal to a potential of the first voltage end VDD in this embodiment). When the first node N1 increases transiently (from the first level LV1 to the second level LV2), due to element characteristics of a transistor, there is a parasitic capacitor between the control end and the second end (that is, the first node N1) of the second switch T2. Therefore, due to the transient increase of the first node N1, a boost voltage enhancement effect may be achieved by means of coupling by the control end of the second switch T2, and from the time point t2 in FIG. 2, the boost voltage enhancement effect causes the first output end 131 to further increase from a third level LV3 to a fourth level LV4. The fourth level LV4 to which the first output end 131 increases is higher than the potential of the first voltage end VDD.

Referring to both FIG. 1 and FIG. 2, in the time period P2, the first node N1 is at a high level, the first switch T1 is turned on, the first clock signal XCLK passes through the first switch T1, and the output signal SR[n] is generated on the second end of the first switch T1.

In the foregoing mechanism, the first output end 131 may increase to the high fourth level LV4, which is far higher than a threshold voltage of the control end of the second switch, so that the second switch T2 may be completely turned on. In this way, the voltage of the first node N1 in the time period P1 may smoothly increase to the potential of the first voltage end VDD, and is not affected by the threshold voltage Vth of the second switch T2 and/or the seventh switch T7. Therefore, even if the threshold voltage Vth of the second switch T2 and/or the seventh switch T7 increases due to a processing factor, the voltage of the first node N1 in the time period P1 does not decrease.

In this disclosure, the voltage of the first node N1 may reach the voltage level of the first voltage end VDD due to the foregoing compensation, and a voltage drop (for example, the voltage of the first node N1 can reach only VDD−2Vth) does not occur on the first node N1 due to two serially connected transistors before. Therefore, regardless of how the threshold voltage Vth changes (for example, the threshold voltage Vth increases due to a long time of operation or a pressurized operation on the display panel), it can still be ensured that the voltage of the first node N1 is not affected by the threshold voltage Vth, which may avoid that the first switch T1 cannot be normally driven due to an insufficient voltage of the first node N1 caused by the increase in the threshold voltage Vth. In conclusion, this disclosure may compensate for the increase in the threshold voltage Vth caused by a long time of operation on the display panel element, and may avoid the problem that the first switch T1 cannot be normally driven.

Further referring to FIG. 2, when a potential of the control end of the second switch T2 increases to the fourth level LV4 and the second switch T2 is turned on, a potential of the second end of the second switch T2 is equal to the potential of the first voltage end VDD.

Actually, because the input stage circuit 130 has the first output end 131 and the second output end 132 that respectively control the second switch T2 (that is, the first output end 131) and the control circuit 120, in the short time when the boost voltage enhancement effect occurs, the potential of the first output end 131 is not affected by the pull-down circuit 110 and the control circuit 120. In other words, the first output end 131 cannot be connected to the second voltage end VSS by using the pull-down circuit 110 or the control circuit 120. Therefore, the boost voltage enhancement effect may totally act on the potential of the first output end 131 and is not limited by a discharge path at the same time.

Figure 3:
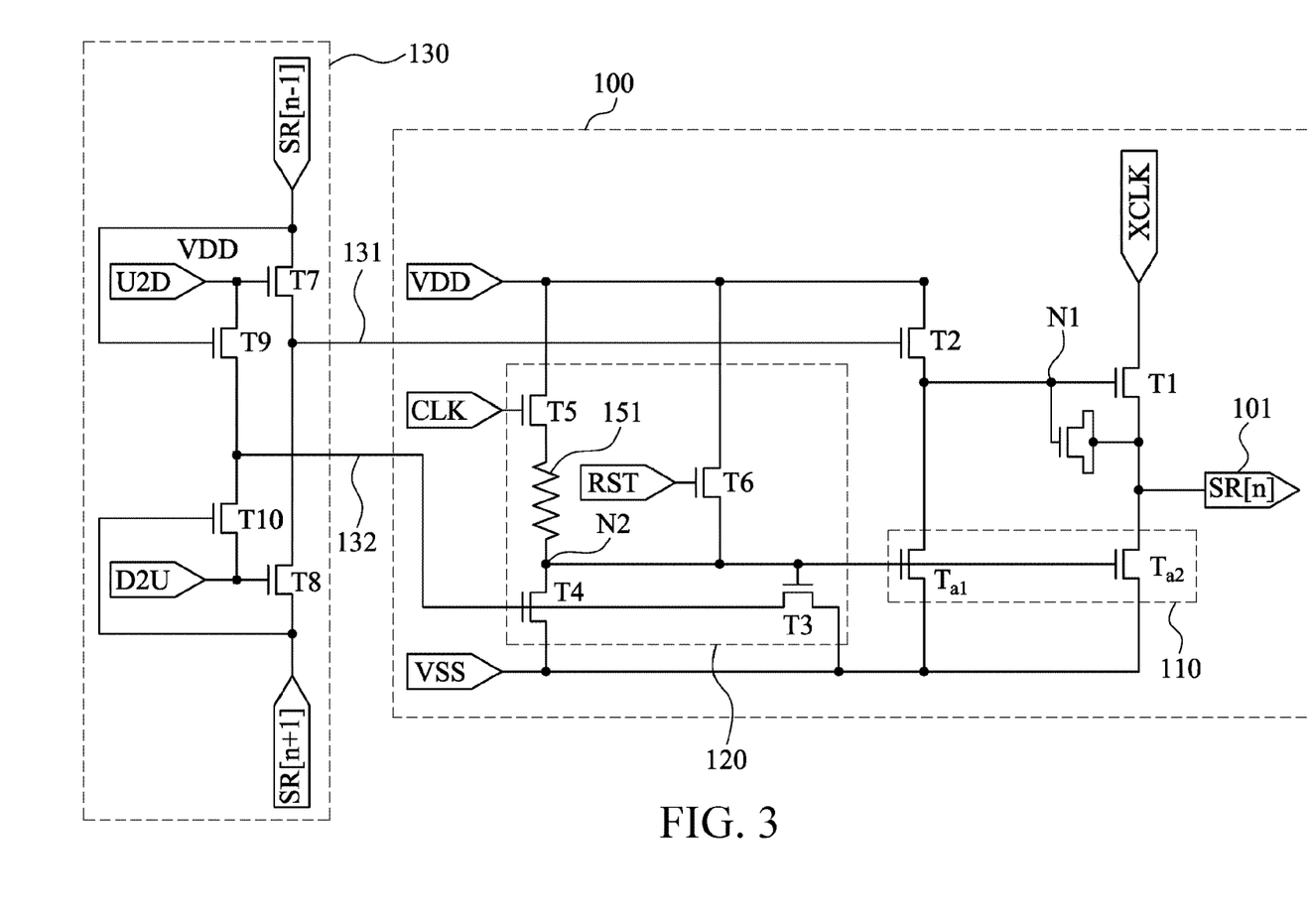
FIG. 3 is a schematic diagram of a shift register in another implementation according to an embodiment of this disclosure.

FIG. 3 is a schematic diagram of an shift register in another implementation according to an embodiment of this disclosure. An shift register 100 includes: a first switch T1, a second switch T2, a pull-down circuit 110, a control circuit 120, and an input stage circuit 130. Its detailed architecture and operations are similar to those in FIG. 1, and are not described herein again. Compared with FIG. 1, FIG. 3 shows an embodiment of this disclosure implemented by using least elements, and the only difference is lack of the protection circuit including the switch $T_{b1}$ and the switch $T_{b2}$ and configured to reduce loss caused by an over-current to the element.

Figure 4:
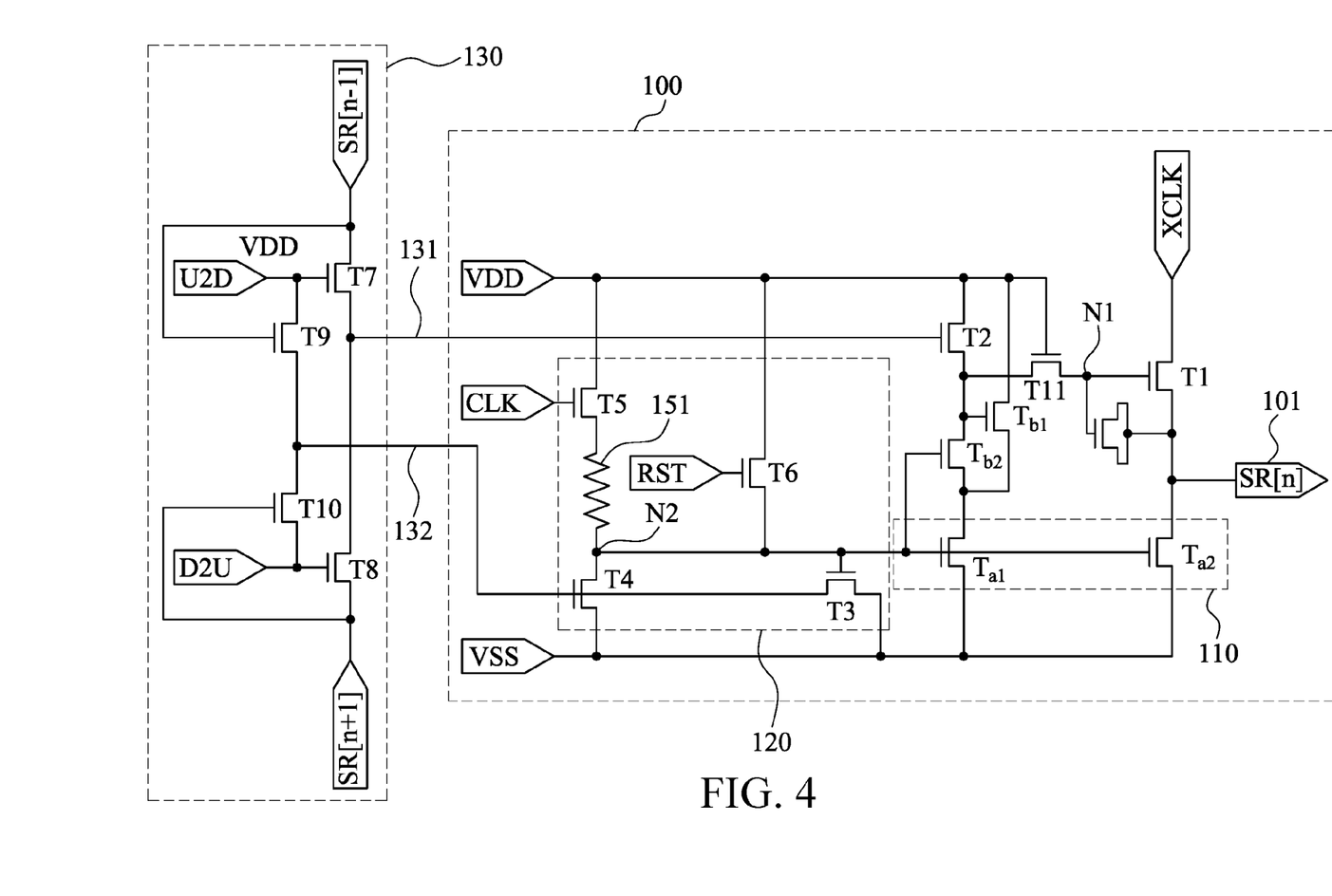
FIG. 4 is a schematic diagram of a shift register in still another implementation according to an embodiment of this disclosure.

FIG. 4 is a schematic diagram of an shift register in still another implementation according to an embodiment of this disclosure. An shift register 100 includes: a first switch T1, a second switch T2, a pull-down circuit 110, a control circuit 120, and an input stage circuit 130. Its detailed architecture and operations are similar to those in FIG. 1, and are not described herein again.

In an embodiment, further referring to FIG. 4, the shift register 100 may include an eleventh switch T11. A first end of the eleventh switch T11 is coupled to a second end of the second switch T2, a second end of the eleventh switch T11 is coupled to a first node N1, and a control end of the eleventh switch T11 is coupled to a first voltage end VDD.

Figure 5:
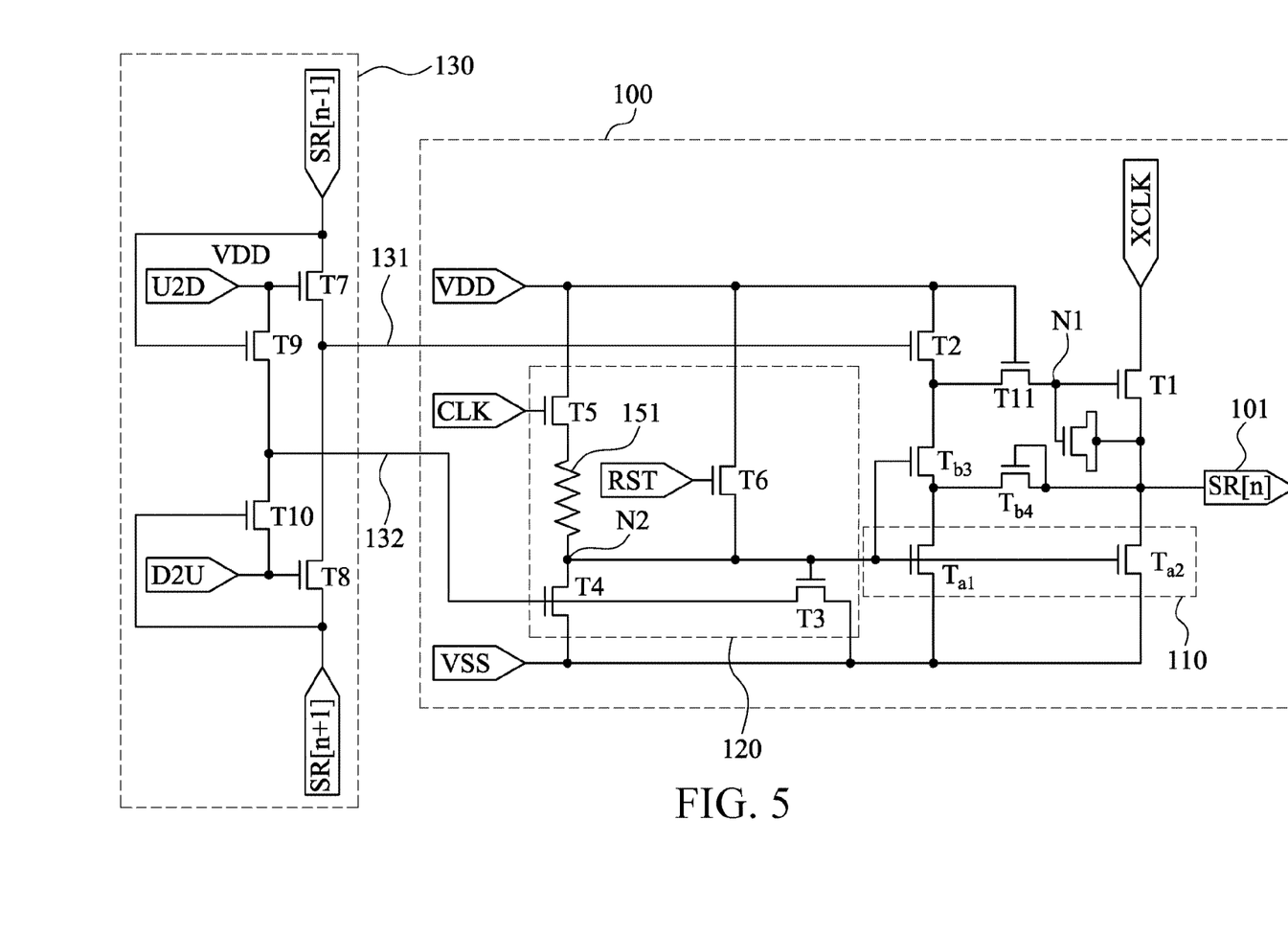
FIG. 5 is a schematic diagram of a shift register in yet another implementation according to an embodiment of this disclosure.

FIG. 5 is a schematic diagram of an shift register in yet another implementation according to an embodiment of this disclosure. As shown in FIG. 5, an shift register 100 includes: a first switch T1, a second switch T2, a pull-down circuit 110, a control circuit 120, and an input stage circuit 130. Its detailed architecture and operations are similar to those in FIG. 1, and are not described herein again.

In an embodiment, further referring to FIG. 5, the shift register 100 may include an eleventh switch T11. Its connection manner is similar to that in FIG. 4, and is not described herein again.

Referring to FIG. 5, the pull-down circuit 110 includes a switch $T_{a1}$ and a switch $T_{a2}$, and its structure is similar to that in the embodiment of FIG. 1. A circuit formed by a switch $T_{b3}$ and a switch $T_{b4}$ may restrain a sharp voltage decrease of a first node N1 caused by current leakage of the switch $T_{a1}$, and the switch $T_{b3}$ and the switch $T_{b4}$ form a protection circuit, so that the shift register 100 of this disclosure may have large current leakage tolerance. In terms of architecture, a first end of the switch $T_{b3}$ is coupled to a second end of the second switch T2 and a first end of the eleventh switch T11. A second end of the switch $T_{b3}$ is coupled to a first end of the switch $T_{a1}$ and a first end of the switch $T_{b4}$. A control end of the switch $T_{b3}$ is coupled to a control end of the switch $T_{a1}$. A second end of the switch $T_{b4}$ is coupled to a control end of the switch $T_{b4}$ and an output end 101 of the shift register 100. The foregoing embodiment is merely an embodiment of the protection circuit, and this disclosure is not limited thereto.

It can be learned from the foregoing implementations of this disclosure that, applying this disclosure has the following advantages: The shift register provided in the embodiments of this disclosure can use least elements to resolve problems that a drive capability of an shift register circuit is lowered and an operational range is reduced because a threshold voltage Vth of a transistor increases due to a long time of operation on a display panel element. In general, in this disclosure, the foregoing technical effects can be achieved by upgrade with lowest costs, thereby resolving the problem of the display panel element in current processing.

Although this disclosure is described above by means of the specific embodiments, the above description is not intended to limit this disclosure. A person skilled in the art of this disclosure can make variations and modifications without departing from the spirit and scope of this disclosure. Therefore, the protection scope of this disclosure is subject to the appended claims.

What is claimed is:

1. A shift register, comprising:
   a first switch, wherein a first end of the first switch is configured to receive a first clock signal, a second end of the first switch is coupled to an output end of the shift register, and a control end of the first switch is coupled to a first node;
   a second switch, wherein a first end of the second switch is coupled to a first voltage end, and a second end of the second switch is coupled to the first node;
   a pull-down circuit, coupled between the first node and a second voltage end, wherein a control end of the pull-down circuit is coupled to a second node, and the pull-down circuit selectively connects the first node to the second voltage end according to a potential of the second node;
a control circuit, wherein an output end of the control circuit is coupled to the second node; and
an input stage circuit, configured to receive an output signal of a previous-stage shift register, an output signal of a next-stage shift register, and at least one scanning order logic signal, wherein a first output end of the input stage circuit outputs the output signal of the previous-stage shift register or the output signal of the next-stage shift register to a control end of the second switch according to the at least one scanning order logic signal, and a second output end of the input stage circuit is triggered by the output signal of the previous-stage shift register or the output signal of the next-stage shift register to output the at least one scanning order logic signal to an input end of the control circuit.

2. The shift register according to claim 1, wherein the control circuit is coupled to the first voltage end and the second voltage end, the control circuit further receives a second clock signal, and the control circuit controls the potential of the second node according to the second clock signal and the at least one scanning order logic signal.

3. The shift register according to claim 2, wherein the control circuit comprises:
a third switch, wherein a first end of the third switch is coupled to the second output end of the input stage circuit, a second end of the third switch is coupled to the second voltage end or the output end of the shift register, and a control end of the third switch is coupled to the second node.

4. The shift register according to claim 3, wherein the control circuit further comprises:
a fourth switch, wherein a first end of the fourth switch is coupled to the second node, a second end of the fourth switch is coupled to the second voltage end, and a control end of the fourth switch is coupled to the second output end of the input stage circuit;
a fifth switch, wherein a first end of the fifth switch is coupled to the first voltage end, a second end of the fifth switch is coupled to the second node, and a control end of the fifth switch receives the second clock signal; and
a sixth switch, wherein a first end of the sixth switch is coupled to the first voltage end, a second end of the sixth switch is coupled to the second node, and a control end of the sixth switch receives a reset signal.

5. The shift register according to claim 4, wherein the control circuit further comprises:
a resistor, coupled between the fifth switch and the second node.

6. The shift register according to claim 1, wherein the input stage circuit further comprises:
a seventh switch, wherein a first end of the seventh switch receives the output signal of the previous-stage shift register, a second end of the seventh switch is coupled to the first output end of the input stage circuit, and a control end of the seventh switch receives a first scanning order logic signal;
an eighth switch, wherein a first end of the eighth switch receives the output signal of the next-stage shift register, a second end of the eighth switch is coupled to the first output end of the input stage circuit, a control end of the eighth switch receives a second scanning order logic signal, and the second scanning order logic signal is reverse to the first scanning order logic signal in direction;

a ninth switch, wherein a first end of the ninth switch receives the first scanning order logic signal, a second end of the ninth switch is coupled to the second output end of the input stage circuit, and a control end of the ninth switch receives the output signal of the previous-stage shift register; and
a tenth switch, wherein a first end of the tenth switch receives the second scanning order logic signal, a second end of the tenth switch is coupled to the second output end of the input stage circuit, and a control end of the tenth switch receives the output signal of the next-stage shift register.

7. The shift register according to claim 1, wherein the pull-down circuit is further coupled between the output end of the shift register and the second voltage end, and the pull-down circuit selectively connects the output end of the shift register to the second voltage end according to the potential of the second node.

8. The shift register according to claim 1, further comprising:
an eleventh switch, wherein a first end of the eleventh switch is coupled to the second end of the second switch, a second end of the eleventh switch is coupled to the first node, and a control end of the eleventh switch is coupled to the first voltage end.

9. The shift register according to claim 8, further comprising:
a fourteenth switch, wherein a first end of the fourteenth switch is coupled to the second end of the second switch and the first end of the eleventh switch, and a second end and a control end of the fourteenth switch are both coupled to the pull-down circuit; and
a fifteenth switch, wherein a first end of the fifteenth switch is coupled to the second end of the fourteenth switch, a control end of the fifteenth switch is coupled to a second end of the fifteenth switch, and the second end of the fifteenth switch is coupled to the output end of the shift register.

10. The shift register according to claim 1, wherein when the output signal of the previous-stage shift register or the output signal of the next-stage shift register turns on the second switch, a potential of the second end of the second switch increases from a first level to a second level, and by means of coupling by a capacitor between the second end and the control end of the second switch, the potential change of the second end of the second switch causes a potential of the control end of the second switch to correspondingly increase from a third level to a fourth level.

11. The shift register according to claim 10, wherein when the potential of the control end of the second switch increases to the fourth level and the second switch is turned on, the potential of the second end of the second switch is equal to a potential of the first voltage end.

12. The shift register according to claim 1, further comprising:
a twelfth switch, wherein a first end of the twelfth switch is coupled to the first voltage end, and a control end of the twelfth switch is coupled to the first node; and
a thirteenth switch, wherein a first end of the thirteenth switch is coupled to the control end of the twelfth switch and the second end of the second switch, a second end of the thirteenth switch is coupled to a second end of the twelfth switch and the pull-down circuit, and a control end of the thirteenth switch is coupled to the pull-down circuit.

* * * * *